(12) United States Patent
Kang

(10) Patent No.: US 11,929,315 B2
(45) Date of Patent: Mar. 12, 2024

(54) SEMICONDUCTOR PACKAGE HAVING PAD WITH REGULAR AND IRREGULAR DEPRESSIONS AND PROTRUSIONS AND METHOD OF MANUFACTURING THE SAME

(71) Applicant: SAMSUNG ELECTRONICS CO., LTD., Suwon-si (KR)

(72) Inventor: Junghoon Kang, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 17/527,414

(22) Filed: Nov. 16, 2021

(65) Prior Publication Data
US 2022/0344252 A1    Oct. 27, 2022

(30) Foreign Application Priority Data

Apr. 27, 2021  (KR) ........................ 10-2021-0054079

(51) Int. Cl.
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3128* (2013.01); *H01L 23/49822* (2013.01); *H01L 23/49894* (2013.01); *H01L 24/16* (2013.01); *H01L 2224/16227* (2013.01)

(58) Field of Classification Search
CPC ........... H01L 23/49838; H01L 23/3128; H01L 23/49822; H01L 23/49894
See application file for complete search history.

(56) References Cited

U.S. PATENT DOCUMENTS

| 6,693,031 B2 | 2/2004 | Advocate, Jr. et al. |
| 8,921,163 B2 | 12/2014 | Park et al. |
| 10,037,973 B2 | 7/2018 | Tseng et al. |
| 2007/0015351 A1 | 1/2007 | Tomimori et al. |
| 2014/0353025 A1 | 12/2014 | Jang et al. |
| 2015/0014027 A1* | 1/2015 | Kaneko ................. H05K 1/113 174/255 |

(Continued)

FOREIGN PATENT DOCUMENTS

JP    5495002 B2    3/2014

*Primary Examiner* — Michael Jung
(74) *Attorney, Agent, or Firm* — Fish & Richardson P.C.

(57) ABSTRACT

A semiconductor package including a redistribution substrate having lower and upper surfaces, the redistribution substrate including a pad on the lower surface, the pad having a first surface and a second surface, and a redistribution layer electrically connected to the pad; a semiconductor chip on the upper surface of the redistribution substrate and electrically connected to the redistribution layer; an encapsulant encapsulating at least a portion of the semiconductor chip; and a protective layer on the lower surface of the redistribution substrate and having an opening exposing at least a portion of the first surface of the pad, wherein the portion of the first surface exposed through the opening includes a recess surface including regular depressions and protrusions and being depressed inwardly toward the second surface, and an edge surface including irregular depressions and protrusions and having a step difference with respect to the recess surface.

17 Claims, 15 Drawing Sheets

(56) References Cited

U.S. PATENT DOCUMENTS

| | | | |
|---|---|---|---|
| 2016/0079087 A1* | 3/2016 | Yeduru | H01L 29/41 257/773 |
| 2020/0075492 A1* | 3/2020 | Choi | H01L 23/49816 |
| 2020/0105693 A1 | 4/2020 | Chang et al. | |
| 2020/0152565 A1* | 5/2020 | Choi | H01L 23/49816 |

* cited by examiner

SEMICONDUCTOR PACKAGE HAVING PAD WITH REGULAR AND IRREGULAR DEPRESSIONS AND PROTRUSIONS AND METHOD OF MANUFACTURING THE SAME

CROSS-REFERENCE TO RELATED APPLICATION

This application claims benefit of priority to Korean Patent Application No. 10-2021-0054079 on Apr. 27, 2021 in the Korean Intellectual Property Office, the disclosure of which is incorporated herein by reference in its entirety.

BACKGROUND

1. Field

Embodiments relate to a semiconductor package and a method of manufacturing the same.

2. Description of the Related Art

A semiconductor package may be mounted on a substrate (e.g., a main board or the like) through various types of connection bumps (e.g., solder balls).

SUMMARY

The embodiments may be realized by providing a semiconductor package including a redistribution substrate having a lower surface and an upper surface opposite to the lower surface, the redistribution substrate including a pad on the lower surface thereof, the pad having a first surface and a second surface opposite to the first surface, and a redistribution layer electrically connected to the pad; a semiconductor chip on the upper surface of the redistribution substrate and electrically connected to the redistribution layer; an encapsulant encapsulating at least a portion of the semiconductor chip; and a protective layer on the lower surface of the redistribution substrate and having an opening exposing at least a portion of the first surface of the pad, wherein the portion of the first surface exposed through the opening includes a recess surface, the recess surface including regular depressions and protrusions and being depressed inwardly toward the second surface, and an edge surface, the edge surface including irregular depressions and protrusions and having a step difference with respect to the recess surface.

The embodiments may be realized by providing a semiconductor package including a redistribution substrate including an insulating layer, a redistribution layer on the insulating layer, and a pad on a side of the insulating layer opposite to the redistribution layer, the pad including a recess surface including regular depressions and protrusions, and an edge surface surrounding the recess surface and including irregular depressions and protrusions; a semiconductor chip on the redistribution substrate and electrically connected to the redistribution layer; and a protective layer on a side of the redistribution substrate opposite to the semiconductor chip, the protective layer including an opening exposing the recess surface.

The embodiments may be realized by providing a semiconductor package including a redistribution substrate including an insulating layer, a redistribution layer on the insulating layer, and a pad on a side of the insulating layer opposite to the redistribution layer, the pad including a recess surface and an edge surface surrounding the recess surface; a semiconductor chip on the redistribution substrate and electrically connected to the redistribution layer; an encapsulant encapsulating at least a portion of the semiconductor chip; and a protective layer on a side of the redistribution substrate opposite to the semiconductor chip, the protective layer including an opening exposing the recess surface and at least a portion of the edge surface, wherein an interval in a vertical direction between the edge surface and an upper surface of the pad is greater than an interval in the vertical direction between the recess surface and the upper surface of the pad, and a surface roughness (Ra) of the recess surface is less than a surface roughness (Ra) of the edge surface.

The embodiments may be realized by providing a method of manufacturing a semiconductor package, the method including forming a redistribution substrate such that the redistribution substrate includes a redistribution layer, a pad electrically connected to the redistribution layer, and a protective layer, the pad having a first surface including irregular depressions and protrusions and a second surface opposite to the first surface, and the protective layer covering the first surface of the pad; mounting a semiconductor chip on the redistribution substrate opposite to the protective layer; forming an encapsulant encapsulating the semiconductor chip; irradiating the protective layer with a laser beam having a pulse width for less than picoseconds to form an opening exposing at least a portion of the first surface, wherein forming the opening includes forming a recess surface on at least a portion of the first surface such that the recess surface is depressed inwardly toward the second surface and includes regular depressions and protrusions, and an edge surface on at least a portion of the first surface such that the edge surface includes the irregular depressions and protrusions and surrounds the recess surface.

BRIEF DESCRIPTION OF DRAWINGS

Features will be apparent to those of skill in the art by describing in detail exemplary embodiments with reference to the attached drawings in which.

DETAILED DESCRIPTION

Figure 1A:
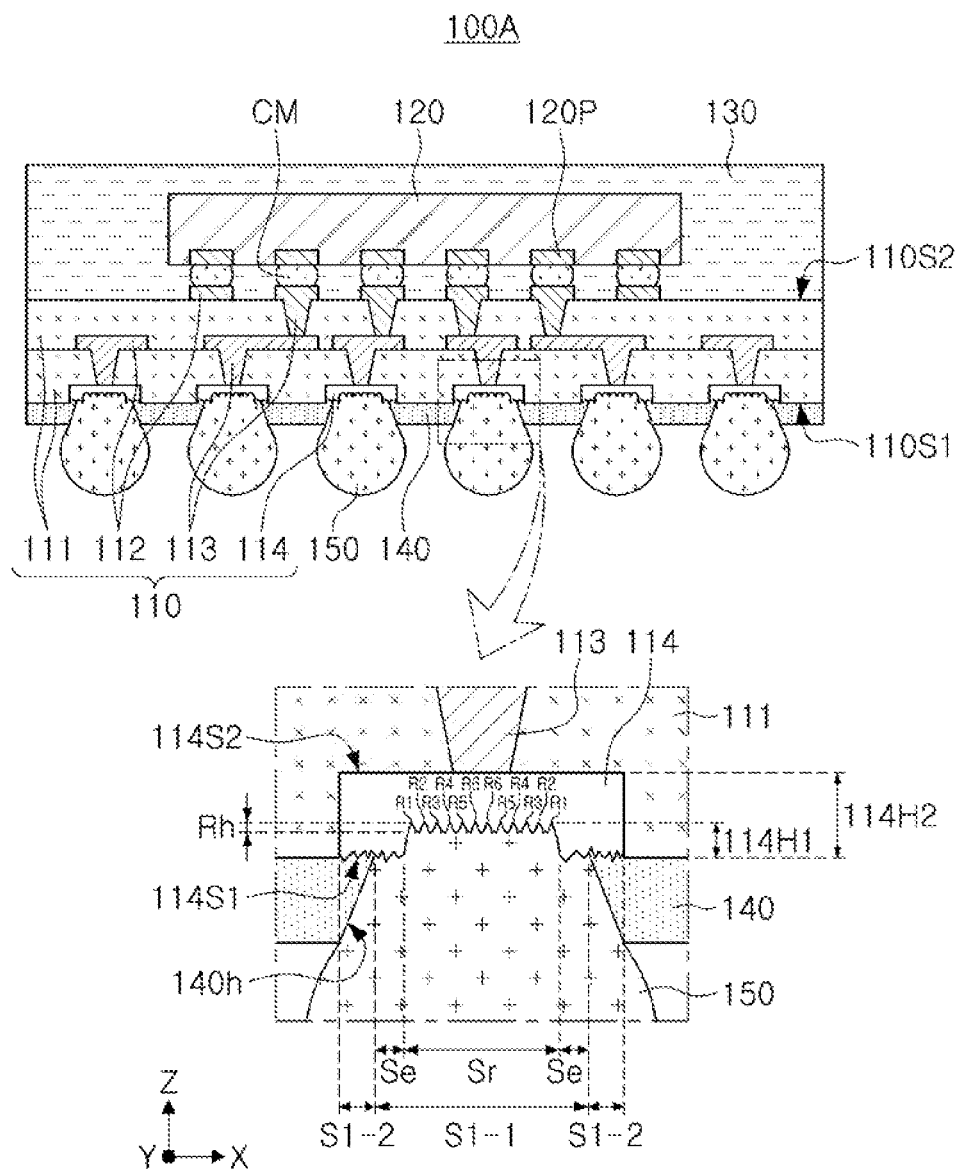
FIG. 1A is a cross-sectional view of a semiconductor package according to an embodiment.
Figure 1B:
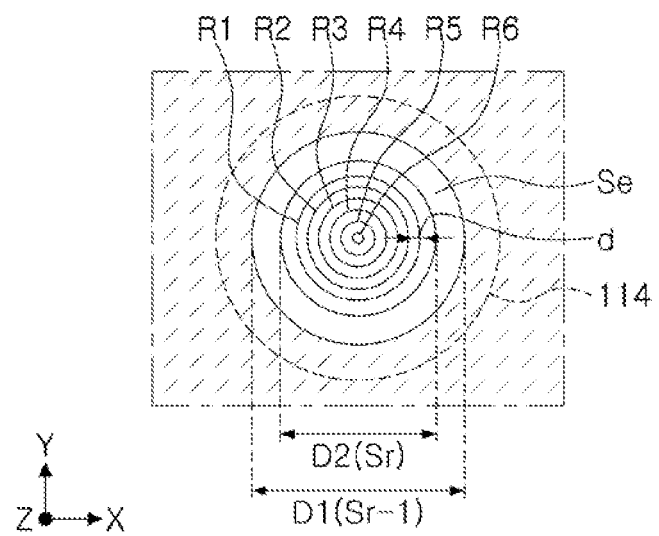
FIG. 1B is a plan view of a partially enlarged region of FIG. 1A in a vertical direction.
Figure 1C:
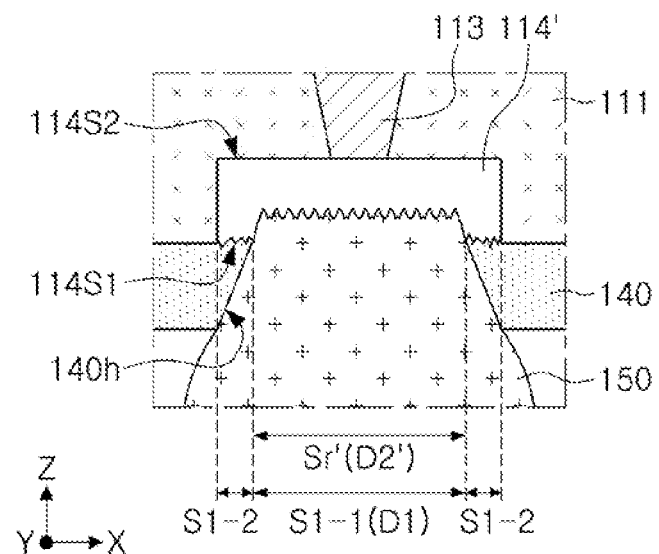
FIG. 1C is a cross-sectional view of a modified example of the partially enlarged region of FIG. 1A.

FIG. 1A is a cross-sectional view of a semiconductor package 100A according to an embodiment, FIG. 1B is a plan view of a partially enlarged region of FIG. 1A in or along a vertical direction (a Z-axis direction), and FIG. 1C is a cross-sectional view of a modified example of the partially enlarged region of FIG. 1A. FIG. 1C illustrates a pad 114' in which a width D2' of a recess surface Sr' is wider than that of the pad 114 of FIG. 1A.

Referring to FIGS. 1A and 1B, a semiconductor package 100A may include a redistribution substrate 110, a semiconductor chip 120, and a protective layer 140. In an implementation, the semiconductor package 100A may further include an encapsulant 130 and a connection bump 150.

The redistribution substrate 110 may include an insulating layer 111, a redistribution layer 112, a redistribution via 113, and a pad 114. The redistribution substrate 110 may have an upper surface 110S2 (on which the semiconductor chip 120 is mounted) and a lower surface 110S1 (on which the pad 114 is disposed). The pad 114 may be electrically connected to the semiconductor chip 120 through the redistribution layer 112. In an implementation, as illustrated in FIG. 1A, the redistribution substrate 110 may be configured such that the pad 114 adjacent to the connection bump 150 is first formed and the redistribution layer 112 is stacked thereon. In an implementation, the redistribution substrate 110 may be configured such that the pad 114 is last formed or such that redistribution layers are stacked on opposing surfaces of a core layer.

The insulating layer 111 may include a plurality of insulating layers 111 stacked in a vertical direction (a Z-direction). The insulating layer 111 may include an insulating resin. The insulating resin may include a thermosetting resin such as an epoxy resin, a thermoplastic resin such as polyimide, or a resin in which an inorganic filler or glass fiber (e.g., glass cloth or glass fabric) is impregnated in those resins, e.g., a prepreg, Ajinomoto Build-up Film (ABF), FR-4, and Bismaleimide Triazine (BT). In an implementation, the insulating layer 111 may include a photosensitive resin such as a photoimageable dielectric (PID) resin. In this case, the insulating layer 111 may be formed to be thinner, and the redistribution layer 112 and the redistribution via 113 having a fine pitch may be formed. Depending on the process, a boundary between the insulating layers 111 having different levels may be unclear or undefined. As used herein, the term "or" is not an exclusive term, e.g., "A or B" would include A, B, or A and B.

The redistribution layer 112 may be on the insulating layer 111. In an implementation, the redistribution layer 112 may include a plurality of redistribution layers 112 at different levels (e.g., different distances from the semiconductor chip 120 in the Z direction) and may be electrically connected to each other through the redistribution vias 113 penetrating through the insulating layer 111. Among the plurality of redistribution layers 112, the redistribution layer 112 on or at the upper surface 110S2 of the redistribution substrate 110 may include a pad portion connected to the semiconductor chip 120. In an implementation, as illustrated in the drawing, only the pad portion is illustrated on the upper surface 110S2 of the redistribution substrate 110, but the pad portion may be connected to one end of the redistribution layer 112 extending on the upper surface 110S2 of the redistribution substrate 110. The redistribution layer 112 may redistribute a connection pad 120P of the semiconductor chip 120. The redistribution layer 112 may include a metal material, e.g., copper (Cu), aluminum (Al), silver (Ag), tin (Sn), gold (Au), nickel (Ni), lead (Pb), or titanium (Ti), or alloys thereof. The redistribution layer 112 may perform various functions according to a design. In an implementation, the redistribution layer 112 may include a ground (GrouND: GND) pattern, a power (PoWeR: PWR) pattern, and a signal (Signal: S) pattern. The signal (S) pattern may provide a transmission path for various signals other than the ground (GND) pattern and the power (PWR) pattern, e.g., a data signal.

The redistribution via 113 may pass through the insulating layer 111 to electrically connect the plurality of redistribution layers 112 at different levels. The redistribution via 113 may include a via for a signal (or a signal via), a via for grounding (or a grounding via), and a via for power (or a power via). The redistribution via 113 may include, e.g., copper (Cu), aluminum (Al), silver (Ag), tin (Sn), gold (Au), nickel (Ni), lead (Pb), or titanium (Ti), or alloys thereof. The redistribution via 113 may have a form of a filled via formed by filling an inside of a via hole with a metal material or a conformal via formed by forming a metal material along an inner wall of the via hole.

The pad 114 may be on the lower surface 110S1 of the redistribution substrate 110 and may have a first surface 114S1 and a second surface 114S2 (opposite to the first surface 114S1). The pad 114 may be on the insulating layer 111, e.g., opposite to the semiconductor chip 120. The second surface 114S2 of the pad 114 may be in contact (e.g., direct contact) with the insulating layer 111, and the first surface 114IS of the pad 114 may be exposed, e.g., may not be covered by and may face away from the insulating layer 111. Part of the pad 114 may be covered by the protective layer 140 to be described below, and a part of the first surface 114S1 of the pad 114 may be connected to the connection bump 150 through an opening 140h of or in the protective layer 140. In an implementation, the first surface 114S1 of the pad 114 may include a first region S1-1 (exposed through or aligned with the opening 140h) and a second region S1-2 in contact with (e.g., covered by) the protective layer 140. Part of the second surface 114S2 of the pad 114 may be in contact (e.g., direct contact) with the redistribution via 113 penetrating through the insulating layer 111 and may be electrically connected to the redistribution layer 112 and the semiconductor chip 120. The first surface 114S1 of the pad 114 may be roughened (e.g., CZ-treated) to help improve adhesion to the protective layer 140. In an implementation, the first surface 114S1 of the pad 114 may include irregular depressions and protrusions. In an implementation, as illustrated in the drawing, only the pad 114 may be on the lower surface 110S1 of the redistribution substrate 110, or the pad 114 may be connected to one end of the redistribution layer 112 and may extend or protrude from the lower surface 110S1 of the redistribution substrate 110.

In an implementation, the opening 140h in the protective layer 140 may be formed using a laser beam under specific conditions, so that a smear remaining on an inner wall of the opening 140h and on the pad 114 may be removed at the same time the opening 140h is formed. In an implementation, a portion of the pad 114 may be removed together with the smear according to process conditions, and irregular depressions and protrusions may be formed in the region from which the pad 114 is removed. Accordingly, in an embodiment, at least a partial region (the "first region" described above) S1-1 of the first surface 114S1 of the pad 114 may include regular (e.g., uniform or periodic) depressions and protrusions, may include a recess region (or 'surface') Sr depressed inwardly, e.g., toward the second surface 114S2, may include an irregular arrangement of depressions and protrusions, and may include an edge region (or 'surface) Se surrounding the recess region Sr. In an implementation, the recess region Sr may include regularly arranged depressions and protrusions (e.g., peaks and valleys having a relatively uniform pitch or depth) and the edge region Se may include an irregular arrangement of depressions and protrusions (e.g., peaks and valleys having different pitches and depths). According to an embodiment, by removing a smear in the recess region Sr and the edge region Se exposed through the opening 140h, connection reliability between the pad 114 and the connection bump 150 may be improved. In addition, by omitting a chemical desmear process, problems (e.g., discoloration of an encapsulant, peeling of the protective layer, or the like) caused by a chemical solution may be prevented and a package manufacturing process may be simplified.

In an implementation, the first region S1-1 of the pad 114 may include the edge surface Se from which a portion of the pad 114 is not removed, in a region adjacent to an inner wall of the opening 140h. In an implementation, an interval 114H2 (e.g., in the Z direction) between the edge surface Se and the upper surface 114S2 of the pad 114 may be greater than an interval 114H1 (e.g., in the Z direction) between the edge surface Se and the recess surface Sr of the pad 114. In an implementation, the interval 114H2 (e.g., in the Z direction) between the edge surface Se and the upper surface 114S2 of the pad 114 may be greater than an interval (e.g., in the Z direction) between the recess surface Sr and the upper surface 114S2 of the pad 114. In an implementation, the recess surface Sr and the edge surface Se may face in the same direction (e.g., may be substantially parallel) and may be positioned on or at different levels. In an implementation, the recess surface Sr may be (e.g., in a plane) at a level between a level of (e.g., a plane of) the second surface 114S2 and a level of (e.g., a plane of) the first surface 114S1 (or the edge surface Se) of the pad 114. In an implementation, by controlling formation conditions of the opening 140h using a laser beam, the level of the edge surface Se may be may be maintained on the level (which is substantially the same as the level of the second region S1-2) before formation of the opening 140H, while a smear of the edge surface Se is removed. In an implementation, a lifting phenomenon of the protective layer 140 (e.g., which could otherwise occur at a triple point where the pad 114, the protective layer 140, and the connection bump 150 all come into contact with each other) may be reduced or prevented. As illustrated in FIG. 1B, on an X-Y plane, the recess surface Sr may be at a center of the opening 140h, and the edge surface Se may be at a periphery of the center to surround the recess surface Sr. Referring to FIG. 1C, in a modified example, most of the first region S1-1 may be formed of or include the recess surface Sr. In an implementation, a diameter D1 of the first region S1-1 may be substantially the same as a diameter D2' of the recess surface Sr'. In this case, by maximizing a smear removal effect, connection reliability between the pad 114' and the connection bump 150 may be further improved.

In an implementation, sizes of the edge surface Se and the recess surface Sr may be suitable sizes, and it may be advantageous to secure the recess surface Sr more than the edge surface Se in terms of smear removal. In an implementation, the recess surface Sr may account for an area of about 90% or more in the first region S1-1. In an implementation, it may be advantageous to secure the edge surface Se to a certain level from the viewpoint of preventing the protective layer 140 from lifting, and the region occupied by the recess surface Sr in the first region S1-1 may have an upper limit of about 98%. In an implementation, a ratio of a diameter D2 of the recess surface Sr to the diameter D1 of the first region S1-1 may be about 0.98:1 to 0.9:1. In an implementation, when the diameter D1 of the first region S1-1 is about 155 the diameter D2 of the recess surface Sr may be about 148 μm.

In an implementation, the recess surface Sr may include regular depressions and protrusions in a portion of the pad 114 is removed along with a smear, and surface roughness Ra of the recess surface Sr may be less than surface roughness Ra of the edge surface Se including the irregular uneven depressions and protrusions of the first surface 114S1. In an implementation, the recess surface Sr may have a surface roughness Ra of about 0.2 μm or less, and the edge surface Se may have a surface roughness Ra of about 0.8 μm or more, e.g., about 0.9 μm to about 1.6 The regular depressions and protrusions of the recess surface Sr may include a plurality of grooves R1, R2, R3, R4, R5, and R6 extending in a plurality of ring shapes so that a relatively small ring is positioned in a relatively larger ring on the plane parallel to the first surface 114S1. In an implementation, the plurality of grooves R1, R2, R3, R4, R5, and R6 may have a depth Rh ranging from about 50 nm to about 150 nm, and may form a pattern of a plurality of concentric circles (radially) spaced apart from each other on the X-Y plane. The plurality of grooves R1, R2, R3, R4, R5, and R6 may be spaced apart at regular intervals. In an implementation, when a spot size of a laser beam is in the range of about 10 μm to about 30 μm, the plurality of grooves R1, R2, R3, R4, R5, and R6 may be formed to be radially spaced apart by a distance d in the range of about 5 μm to about 15 μm.

The semiconductor chip 120 is on an upper surface 110S2 of the redistribution substrate 110 and may include the connection pad 120P electrically connected to the redistribution layer 112. The semiconductor chip 120 may be mounted on the redistribution substrate 110 by a flip-chip bonding method. In an implementation, the semiconductor chip 120 may be disposed such that an active surface thereof on which the connection pad 120P faces the upper surface 110S2 of the redistribution substrate 110, and the connection pad 120P may be connected to the pad portion of the redistribution layer 112 through a connection member CM. The connection member CM may have a land, ball, or pin shape. The connection member CM may include, e.g., tin (Sn) or an alloy (e.g., Sn-A g-Cu) including tin (Sn). The connection pad 120P may include, e.g., a metal such as aluminum (Al). An underfill resin surrounding the connection member CM may be further included between the semiconductor chip 120 and the redistribution substrate 110. In an implementation, the semiconductor chip 120 may be mounted using a wire bonding method.

The semiconductor chip 120 may be a logic chip or a memory chip. A logic chip may include, e.g., a central processing unit (CPU), a graphics processing unit (GPU), a field programmable gate array (FPGA), a digital signal processor (DSP), a cryptographic processor, a microprocessor, a microcontroller, an analog-to-digital converter (ADC), an application-specific integrated circuit (ASIC), and the like. Memory chips may include, e.g., volatile memory devices such as dynamic RAM (DRAM), static RAM (SRAM), or the like, or nonvolatile memory devices such as phase change RAM (PRAM), magnetic RAM (MRAM), resistive RAM (RRAM), flash memory, and the like.

The encapsulant 130 may be on the redistribution substrate 110 and may seal at least a portion of the semiconductor chip 120. The encapsulant 130 may include an insulating material, e.g., a thermosetting resin such as an epoxy resin, a thermoplastic resin such as polyimide, or a prepreg including an inorganic filler or glass fiber, ABF, FR-4, BT, epoxy molding compound (EMC), etc. In an implementation, a chemical desmear process may be omitted after the opening 140h for opening the pad 114 is formed, and thus, discoloration of the encapsulant 130 (that could otherwise occur in the desmear process) may be prevented.

The protective layer 140 may be on the redistribution substrate 110 opposite to the semiconductor chip 120 and may have an opening 140h exposing at least a portion of the pad 114. The protective layer 140 may be on the lower surface 110S1 of the redistribution substrate 110 to cover the first surface 114S1 of the pad 114. The protective layer 140 may protect the pad 114 from an external environment and may define a formation region of the connection bump 150 through the opening 140h exposing the pad 114. In an implementation, a minimum width of the opening 140h may be substantially equal to the diameter D1 of the first region S1-1, and the minimum width of the opening 140h may be greater than or substantially equal to a maximum width D2 of the recess surface Sr (see FIGS. 1A and 1C). In an implementation, the opening 140h may expose the recess surface Sr and at least a portion of the edge surface Se of the pad 114 together. The protective layer 140 may include a thermosetting resin such as an epoxy resin, a thermoplastic resin such as polyimide, a resin in which an inorganic filler or glass fiber (e.g., glass cloth or glass fabric) is impregnated in those resins, for example, prepreg, ABF, FR-4, or BT. In an implementation, in consideration of the functional characteristics of the protective layer 140 exposed to the outside of the package and protecting the pad 114 and the connection bump 150, the protective layer 140 may include an insulating resin having excellent heat resistance, flame retardancy, or the like. In an implementation, the protective layer 140 may include a non-photosensitive resin in which an inorganic filler is impregnated. In an implementation, the opening 140h may be formed in the protective layer 140 by a laser beam under specific conditions and the resin and residual inorganic filler dissolved on the wall surface of the opening 140h or the surface of the pad 114 are removed, and after the protective layer 140 is processed (or worked), a desmear process using a chemical solution may be omitted.

The connection bump 150 may be in the opening 140h of the protective layer 140 and may be in direct contact with the recess surface Sr and the edge surface Se. The connection bump 150 may include a low melting point metal, e.g., tin (Sn) or an alloy (Sn-A g-Cu) containing tin (Sn). The connection bump 150 may have a land, ball, or pin shape. In an implementation, the connection bump 150 may include a copper pillar or a solder ball. In an implementation, a smear on the pad 114 may be removed without a chemical desmear process, and reliability of physical and electrical contact between the connection bump 150 and the pad 114 may be secured.

Figure 2:
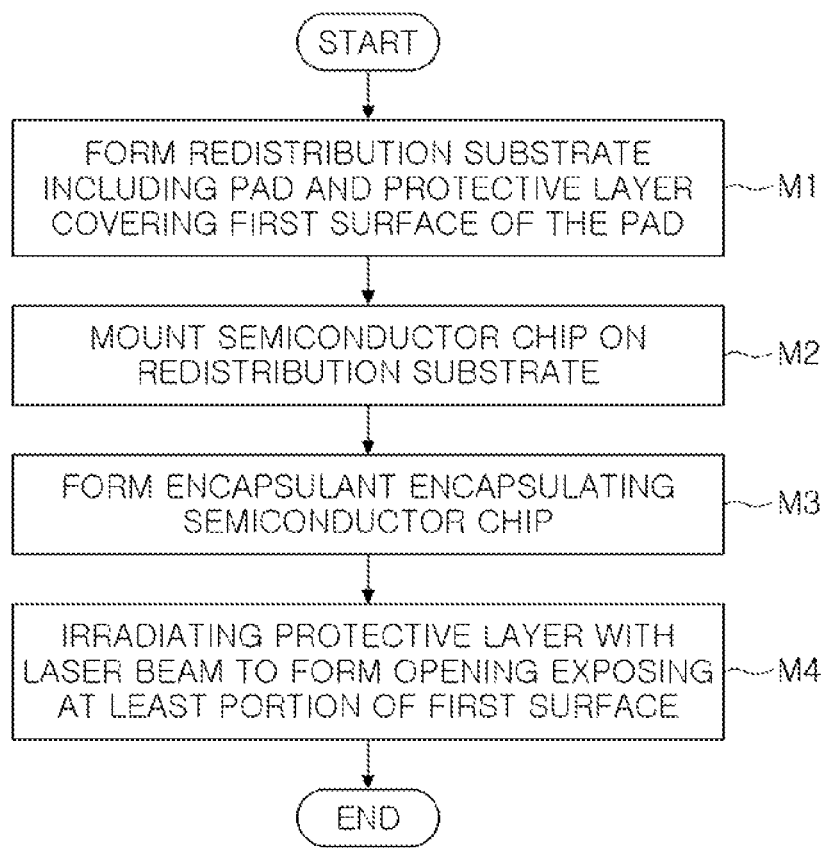
FIG. 2 is a process flow diagram of a method of manufacturing a semiconductor package of FIG. 1A.
Figure 3A:
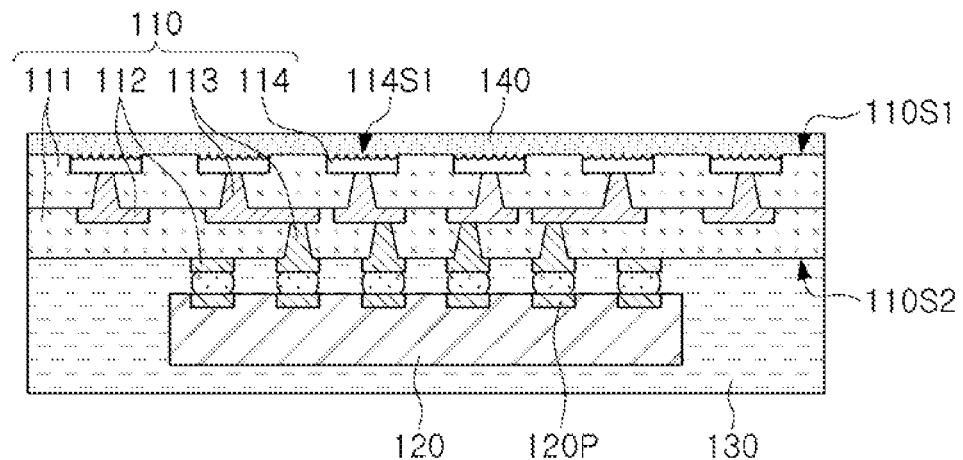
FIGS. 3A and 3B are cross-sectional views of stages in a method of manufacturing a semiconductor package according to FIG. 2.
Figure 3B:
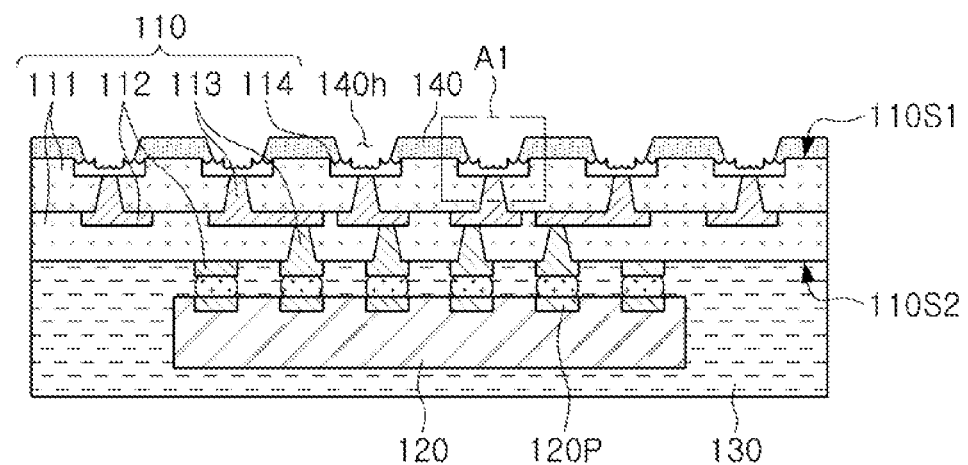
Figure 3C:
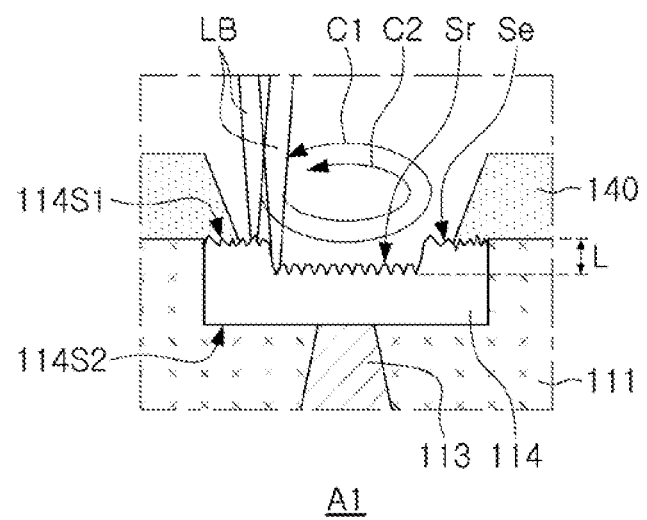
FIG. 3C is a partially enlarged cross-sectional view of a manufacturing process of a region 'A1' of FIG. 3B.

FIG. 2 is a flowchart of a process of manufacturing the semiconductor package 100A of FIG. 1A, FIGS. 3A and 3B are cross-sectional views of stages in a process of manufacturing the semiconductor package according to FIG. 2, and FIG. 3C is a partially enlarged cross-sectional view illustrating a manufacturing process a region 'A1' of FIG. 3B. FIG. 3A illustrates a package structure that has undergone the processes 'M1', 'M2', and 'M3' of FIG. 2.

Referring to FIGS. 2, 3A, and 3B, a method of manufacturing the semiconductor package 100A according to an embodiment may include forming the redistribution substrate 110 including the protective layer 140 (M1), mounting the semiconductor chip 120 (M2), forming an encapsulant 130 (M3), and irradiating the protective layer 140 with a laser beam to form the opening 140h (M4).

In operation M1 of forming the redistribution substrate 110 including the protective layer 140, the redistribution substrate 110 in which one surface 110S1 is covered by the protective layer 140 may be formed. The redistribution substrate 110 may include an insulating layer 111, a redistribution layer 112 on the insulating layer 111, and a redistribution via 113 electrically connected to the redistribution layer 112 through the insulating layer 111, and a pad 114 on one surface 110S1 of the redistribution substrate 110. The insulating layer 111 may be formed by applying and curing a photosensitive resin (e.g., PID) on a carrier, and the redistribution layer 112 and the redistribution via 113 may be formed using a photo process, an etching process, a plating process, or the like. A pad 114 having a first surface 114S1 on which irregular depressions and protrusions is formed and a second surface 114S2 opposite to the first surface 114S1 and electrically connected to the redistribution layer 112 through the redistribution via 113 may be on one surface 110S1 of the redistribution substrate 110. In an implementation, the pad 114 may be formed before the insulating layer 111, the redistribution layer 112, and the redistribution via 113. In an implementation, after the pad 114 is first formed on the carrier, the insulating layer 111, the redistribution via 113, and the redistribution layer 112 may be sequentially formed. Next, the first surface 114S1 of the pad 114 may be roughened, and a non-photosensitive resin (e.g., ABF) in which an inorganic filler is impregnated may be applied and cured on one surface 110S1 of the redistribution substrate 110 to form the protective layer 140.

In operation M2 of mounting the semiconductor chip 120, the semiconductor chip 120 may be mounted on one surface 110S2 of the redistribution substrate 110 (on the opposite side on which the protective layer 140 is disposed), and the semiconductor chip 120 may be electrically connected to the redistribution layer 112. In an implementation, the semiconductor chip 120 may be mounted in a flip-chip manner, or may be mounted in a wire bonding manner.

In operation M3 of forming the encapsulant 130, the semiconductor chip 120 may be encapsulated on one surface 110S1 of the redistribution substrate 110 using a molding material. The encapsulant 130 may be formed by applying and curing a molding material (e.g., EMC) and grinding a non-active surface side of the semiconductor chip 120. In other methods, the encapsulant 130 could have a discoloration defect during a chemical desmear process after the protective layer 140 is worked, but in the present embodiment, the protective layer 140 may be worked using a laser beam under specific conditions, thereby removing a smear remaining in the opening 140H, without performing a chemical desmear process.

Hereinafter, a method of working the protective layer 140 according to an embodiment will be described with reference to FIGS. 3B and 3C.

Referring to FIGS. 3B and 3C, in operation M4 of forming the opening 140h by irradiating the protective layer 140 with a laser beam LB, portions of the protective layer 140 and the pad 114 may be removed. The laser beam LB may be an ultra short pulse laser having a wavelength having a transmittance of less than about 10% with respect to the protective layer 140 (e.g., a wavelength in the range of about 300 nm to about 360 nm), a peak power of 40 kW or more, and a pulse width of less than or equal to picoseconds. The peak power of the laser beam LB may about 40 kW or more, such as, for example, in a range about 40 kW to about 200 kW, about 40 kW to about 100 kW, or about 40 kW to about 80 kW. The laser beam LB may remove the protective layer 140 and remove a smear remaining on the pad 114. In an implementation, by adjusting intensity of the laser beam LB, the recess surface Sr (e.g., depressed toward the second surface 114S2) and the edge surface Se (in which a height and surface roughness of the first surface 114S1 are maintained as it is) may be formed. In an implementation, the recess surface Sr having a predetermined step difference L with or from the first surface 114S1 or the edge surface Se may be formed by irradiating a laser beam LB along a first path C1 adjacent to the protective layer 140 once and irradiating a laser beam LB along a second path C2 adjacent to the center of the opening 140h (e.g., inwardly from the first path C1). In the recess surface Sr, a portion of the pad 114 may be removed together with a smear by the laser beam LB to form regular depressions and protrusions. The grooves R1, R2, R3, R4, R5, and R6 formed in the recess surface Sr may correspond to movement paths of the laser beam LB, respectively. In an implementation, as illustrated in FIG. 3C, only one path C2 of the laser beam LB may irradiate the recess surface Sr, or the laser beam LB may be irradiate along a plurality of paths to form the grooves R1, R2, R3, R4 R5, and R6. In an implementation, a smear may be removed at the same time as the pad 114 is opened or recessed without a chemical desmear process using an ultra-short pulse laser, the manufacturing process may be simplified, and reliability of the pad 114 may be secured. For example, a solder ball shear test (INS01651-027) was performed after attaching a solder ball on the pad 114 formed according to an embodiment, and it was found to have a shear strength of about 196 gf or more. The test was performed under the conditions that a maximum width of the opening 140h was about 160 μm, a maximum width of the solder ball was about 150 μm, and a ratio of a diameter (132 of FIG. 1C) of the recess surface to the diameter ('D' of FIG. 1C) of the first region was about 0.95:1.

Figure 4:
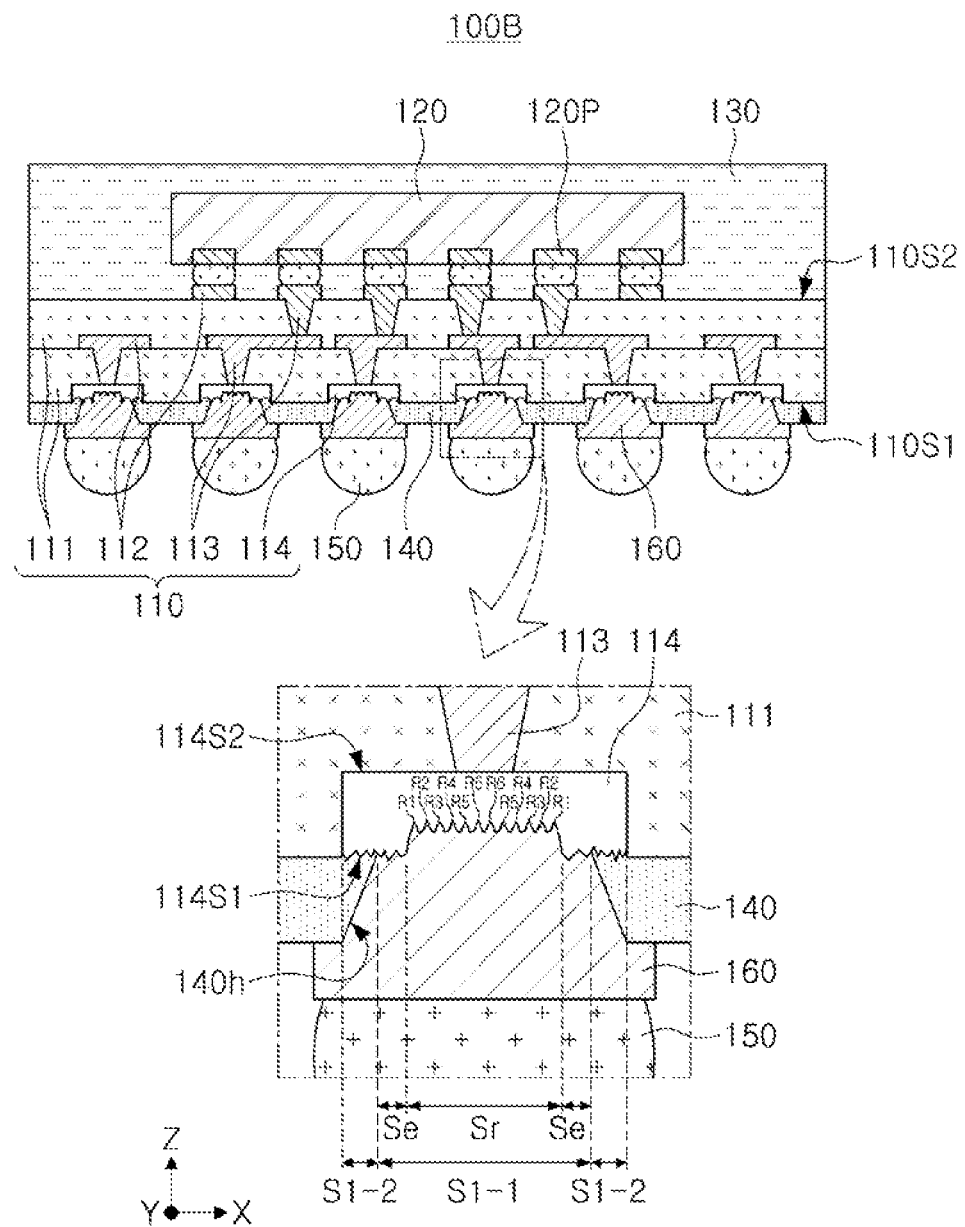
FIG. 4 is a cross-sectional view of a semiconductor package according to an embodiment.

FIG. 4 is a cross-sectional view of a semiconductor package 100B according to an embodiment.

Referring to FIG. 4, the semiconductor package 100B of an embodiment may have similar characteristics as those of the semiconductor package 100A of FIG. 1A, except that an under bump metallization (UBM) structure 160 may be in the opening 140h and may protrude outwardly from the protective layer 140. The connection bump 150 may be on the UBM structure 160 and may be electrically connected to the pad 114 through the UBM structure 160. In an implementation, a smear may be removed on the recess surface Sr and the edge surface Se exposed through the opening 140h, adhesion between the UBM structure 160 and the pad 114 may be excellent, and reliability of the connection bump 150 may be secured through the UBM structure 160. The UBM structure 160 may include a metal, e.g., copper (Cu), aluminum (Al), silver (Ag), tin (Sn), gold (Au), nickel (Ni), lead (Pb), titanium (Ti), or alloys thereof. The UBM structure 160 may help improve connection reliability of the connection bump 150 and improve board level reliability of the semiconductor package 100B. The UBM structure 160 may be formed using electroless and electrolytic plating.

Figure 5:
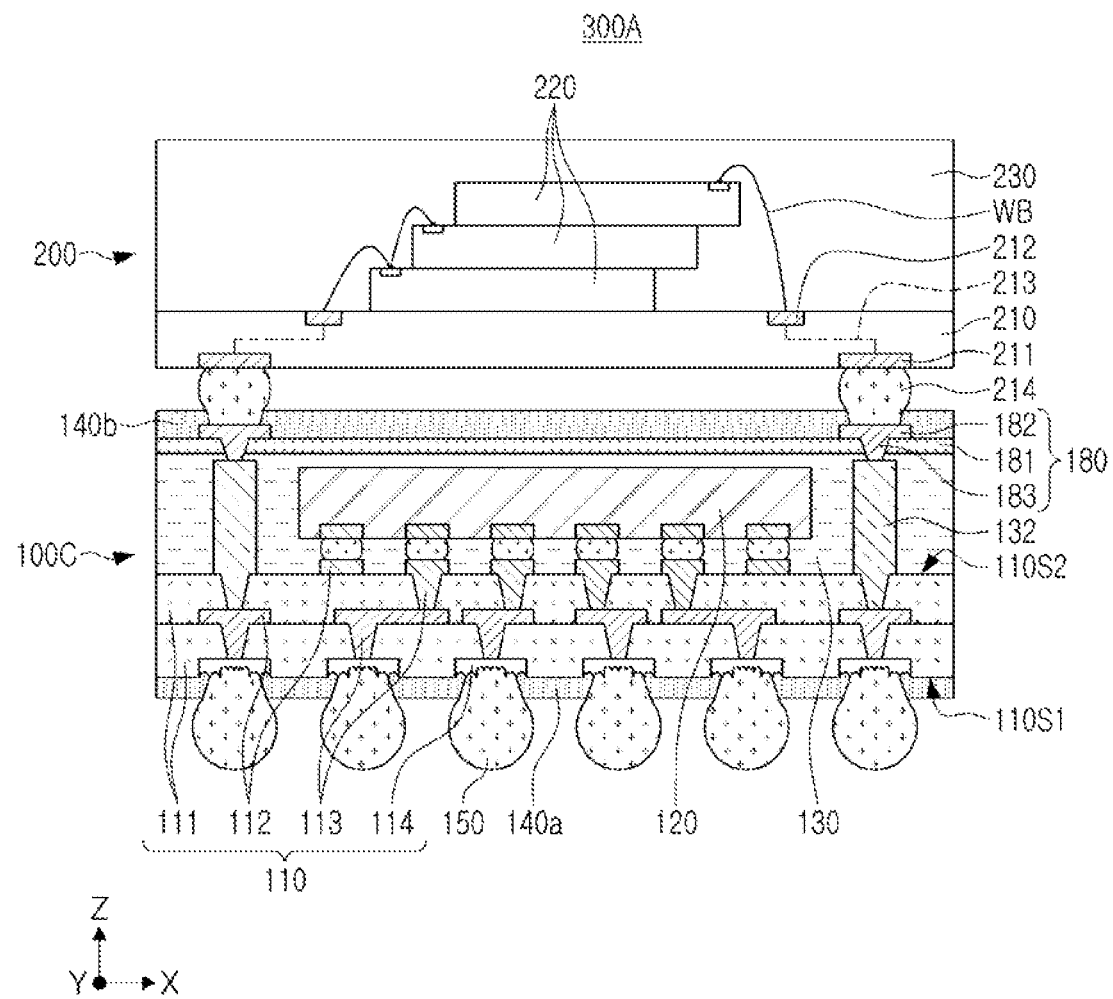
FIG. 5 is a cross-sectional view of a semiconductor package according to an embodiment.

FIG. 5 is a cross-sectional view of a semiconductor package 300A according to an embodiment.

Referring to FIG. 5, the semiconductor package 300A according to an embodiment may include a first package 100C and a second package 200 coupled in a package-on-package form. The first package 100C may have similar characteristics as those of the semiconductor packages 100A, 100B, 100C, and 100D illustrated in FIGS. 1 to 5, except that a through via 132 penetrating through a first encapsulant 130 and a rear redistribution structure 180 may be further provided. The through via 132 may be electrically connected to the redistribution layer 112. The through via 132 may have a shape in which a conductive post penetrates through at least a portion of the first encapsulant 130. The through via 132 may provide an electrical connection path passing through the first package 100 in a vertical direction. The first package 100C may further include a second protective layer 140b disposed on the rear redistribution structure 180. The second protective layer 140b may include an insulating resin similar to that of the first protective layer 140a, e.g., ABF.

The rear redistribution structure 180 may include a rear insulating layer 181, a rear redistribution layer 182 on the rear insulating layer 181, and a rear redistribution via 183 connecting the rear redistribution layer 182 to the through via 132 through the rear insulating layer 181. The rear insulating layer 181 may be on an upper surface of the first encapsulant 130. The rear insulating layer 181 may include an insulating resin similar to that of the insulating layer 111 of the redistribution substrate 110, e.g., a photosensitive resin. The rear redistribution layer 182 and the rear redistribution via 183 may include a conductive material similar to that of the redistribution layer 112 and the redistribution via 113 of the redistribution substrate 110.

The second package 200 may include a second redistribution substrate 210, a second semiconductor chip 220, and a second encapsulant 230. The second redistribution substrate 210 may include pads 211 and 212 electrically connected to the outside on lower and upper surfaces thereof, respectively. Also, the second redistribution substrate 210 may include a redistribution circuit 213 electrically connecting the pads 211 and 212 therein.

The second semiconductor chip 220 may be mounted on the second redistribution substrate 210 by wire bonding or flip-chip bonding. In an implementation, a plurality of second semiconductor chips 220 may be vertically stacked on the second redistribution substrate 210 and may be connected to the pads 211 of the second redistribution substrate 210 and may be electrically connected to the pads 211 of the second redistribution substrate 210 by bonding wires WB. The second semiconductor chip 220 may include an integrated circuit different from that of the first semiconductor chip 120 in the first package 100C. In an implementation, the second semiconductor chip 220 may include a memory chip, and the first semiconductor chip 120 may include an application processor (AP) chip.

The second encapsulant 230 may include a material which is the same as or similar to that of the first encapsulant 130. The second package 200 may be physically and electrically connected to the first package 100C by a metal bumps 214. The metal bump 214 may be electrically connected to the redistribution circuit 213 inside the second redistribution substrate 210 through the pads 212 on the lower surface of the second redistribution substrate 210. The metal bump 214 may include a low melting point metal, e.g., tin (Sn) or an alloy including tin (Sn).

Figure 6A:
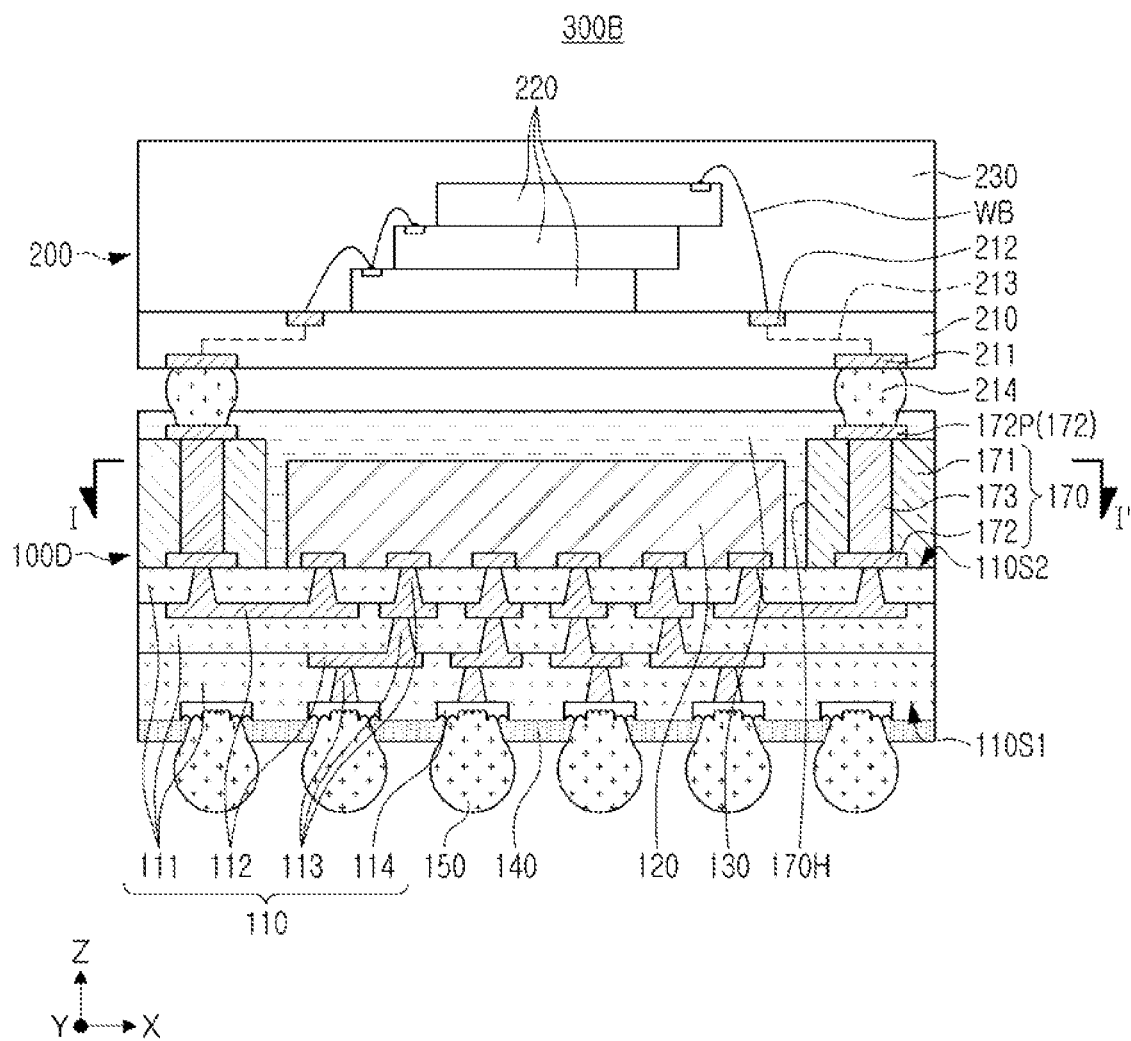
FIGS. 6A and 6B are views of a semiconductor package according to an embodiment.
Figure 6B:
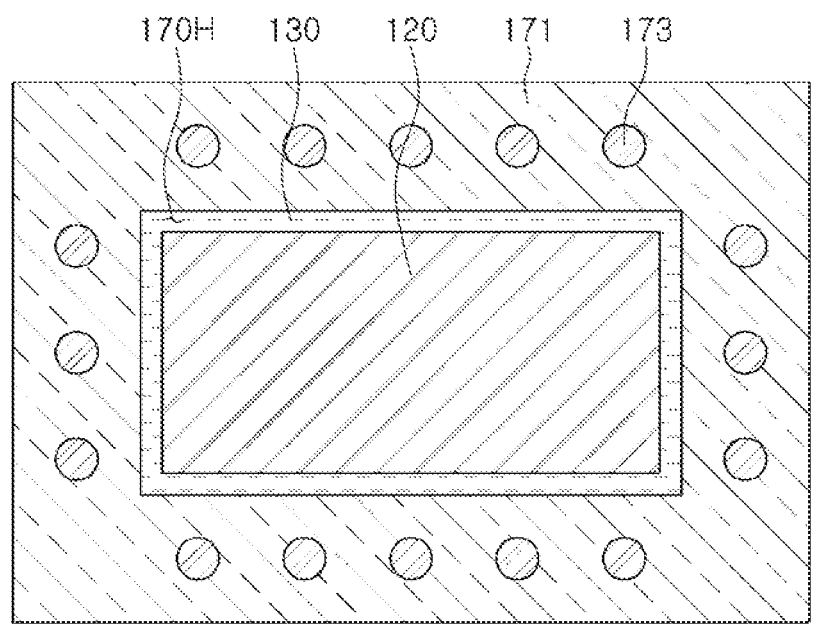

FIGS. 6A and 6B are views of a semiconductor package 300B according to an embodiment. FIG. 6B is a plan view taken along line I-I' of FIG. 6A.

Referring to FIGS. 6A and 6B, the semiconductor package 300B according to an embodiment may have characteristics similar to those of the semiconductor package 300A illustrated in FIG. 5, except that a vertical connection structure 170, instead of the through via 132 illustrated in FIG. 5, may be provided. The vertical connection structure 170 may include an insulating layer 171, a wiring layer 172, and a wiring via 173. The vertical connection structure 170 may help further improve rigidity of the package depending on a material of the insulating layer 171 and may help improve uniformity of a thickness of the first encapsulant 130. The vertical connection structure 170 may have a through hole 170H penetrating through the insulating layer 171. The first semiconductor chip 120 may be in the through hole 170H. In an implementation, the through hole 170H may have a wall surface surrounding the first semiconductor chip 120.

In an implementation, the material of the insulating layer 171 may include, e.g., a thermosetting resin such as an epoxy resin, a thermoplastic resin such as polyimide, or a resin in which these resins are mixed with an inorganic filler, for example, ABF or the like may be used. In an implementation, a material in which the aforementioned resin is impregnated in glass fiber (or glass cloth or glass fabric) together with an inorganic filler, e.g., a prepreg, may be used.

The wiring layer 172 may be electrically connected to the redistribution layer 112 of the redistribution substrate 110 and may provide an electrical connection path that vertically passes through the first package 100D together with the wiring via 173. The wiring layer 172 may include copper (Cu), aluminum (Al), silver (Ag), tin (Sn), gold (Au), nickel (Ni), lead (Pb), titanium (Ti), or alloys thereof. The wiring layer 172 may include a wiring pad 172P electrically connected to the metal bump 214.

The wiring via 173 may electrically connect the wiring layers 172 formed in different layers, and as a result, an electrical path may be formed in the vertical connection structure 170. The wiring via 173 may include copper (Cu), aluminum (Al), silver (Ag), tin (Sn), gold (Au), nickel (Ni), lead (Pb), titanium (Ti), or alloys thereof. The wiring via 173 may be a field-type via filled with a metal or may be a conformal-type via in which a metal is formed on a wall surface of a via hole.

In an implementation, the first semiconductor chip 120 may be mounted on the upper surface 110S2 of the redistribution substrate 110 without a connection member ('CM' in FIG. 1A). This structure may be implemented by encapsulating the first semiconductor chip 120 using the first encapsulant 130 on a temporary carrier and subsequently forming the insulating layer 111, the redistribution layer 112, and the redistribution via 113 directly on a lower surface of the first encapsulant 130 and the first semiconductor chip 121 from which the temporary carrier is removed. In an implementation, the connection pad 120P of the first semiconductor chip 120 may directly contact the redistribution via 113. In this case, an overall thickness of the package may be reduced and connection reliability between the semiconductor chip and the redistribution layer (or redistribution via) may be improved.

Figure 7A:
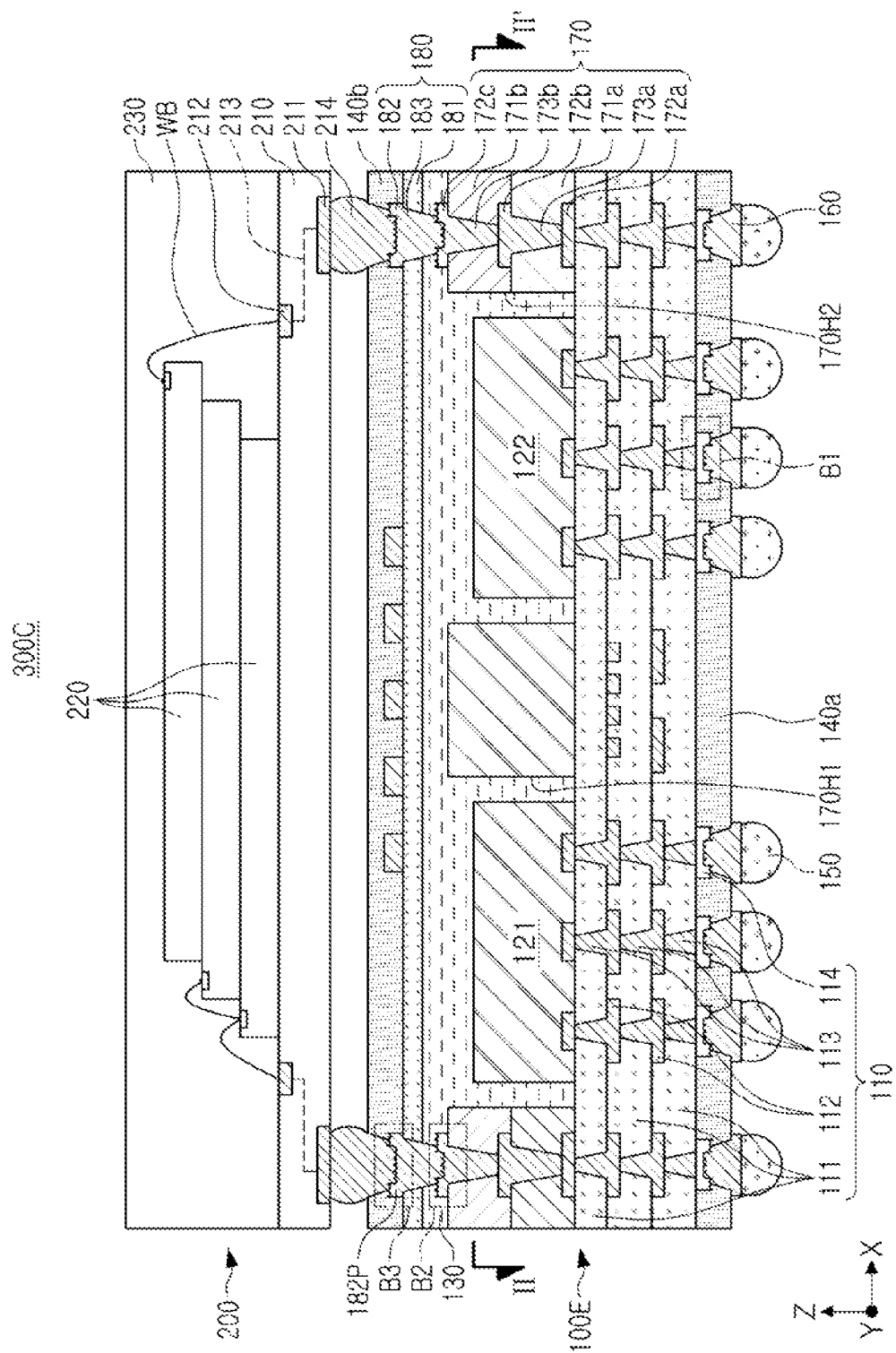
FIGS. 7A and 7B are views of a semiconductor package according to an embodiment.
Figure 7B:
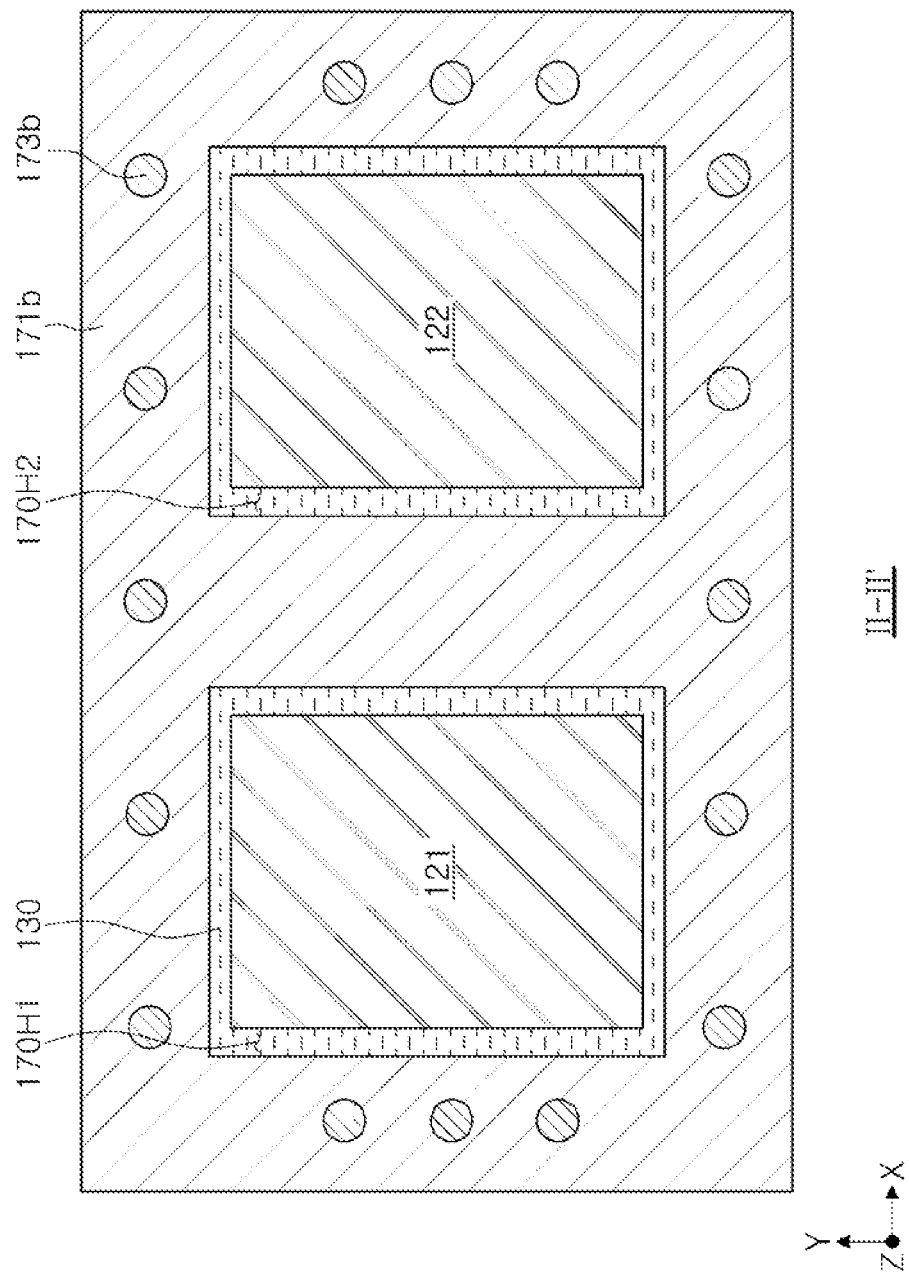
Figure 8A:
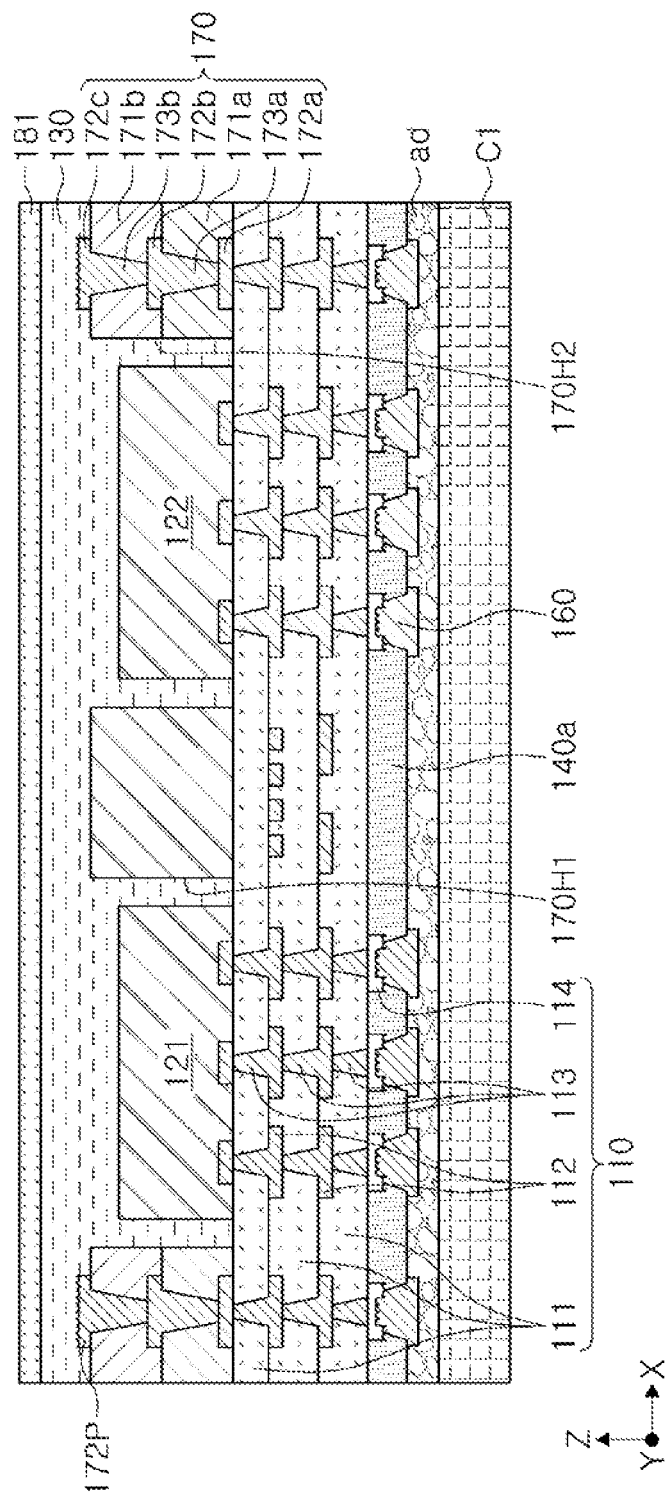
FIGS. 8A and 8B are cross-sectional views of stages in a manufacturing process of a region 'B2' of the semiconductor package of FIG. 7A.
Figure 8B:
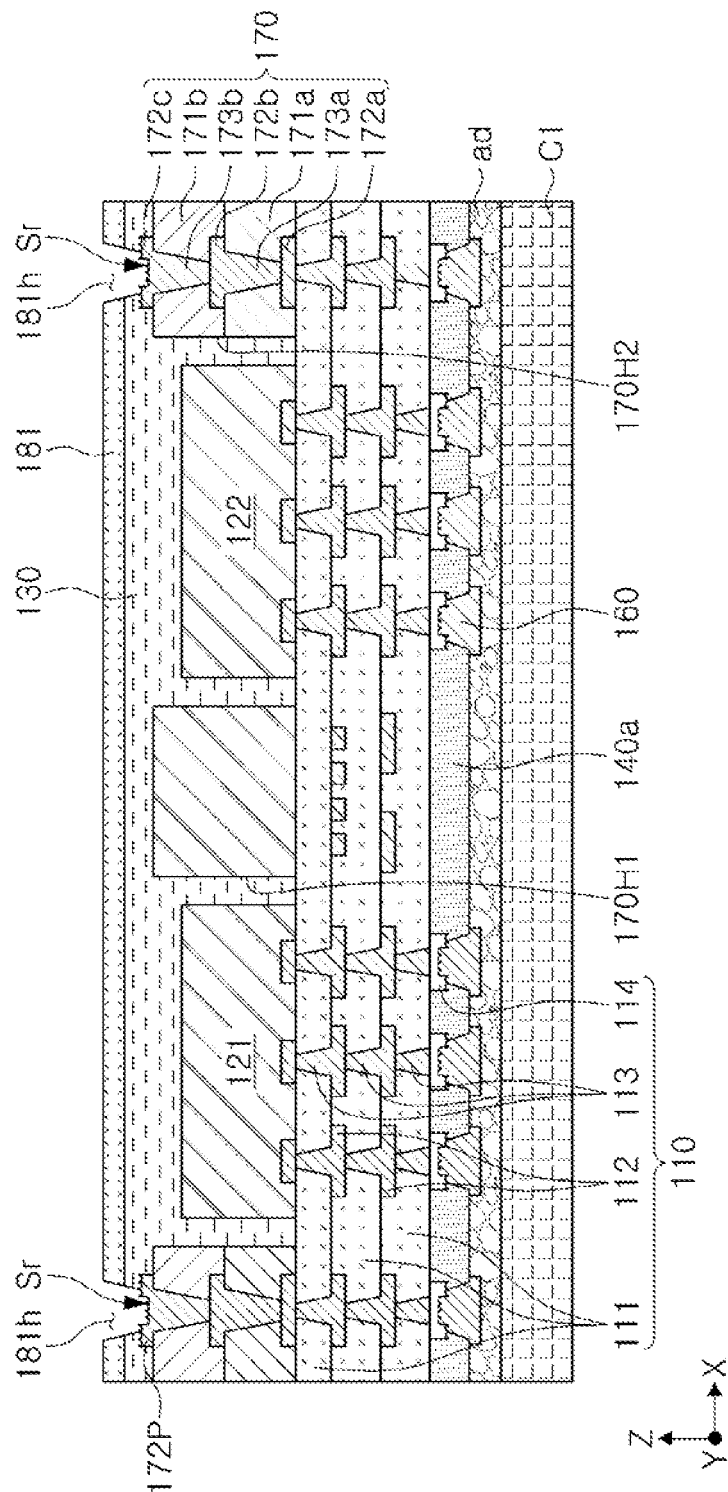
Figure 9A:
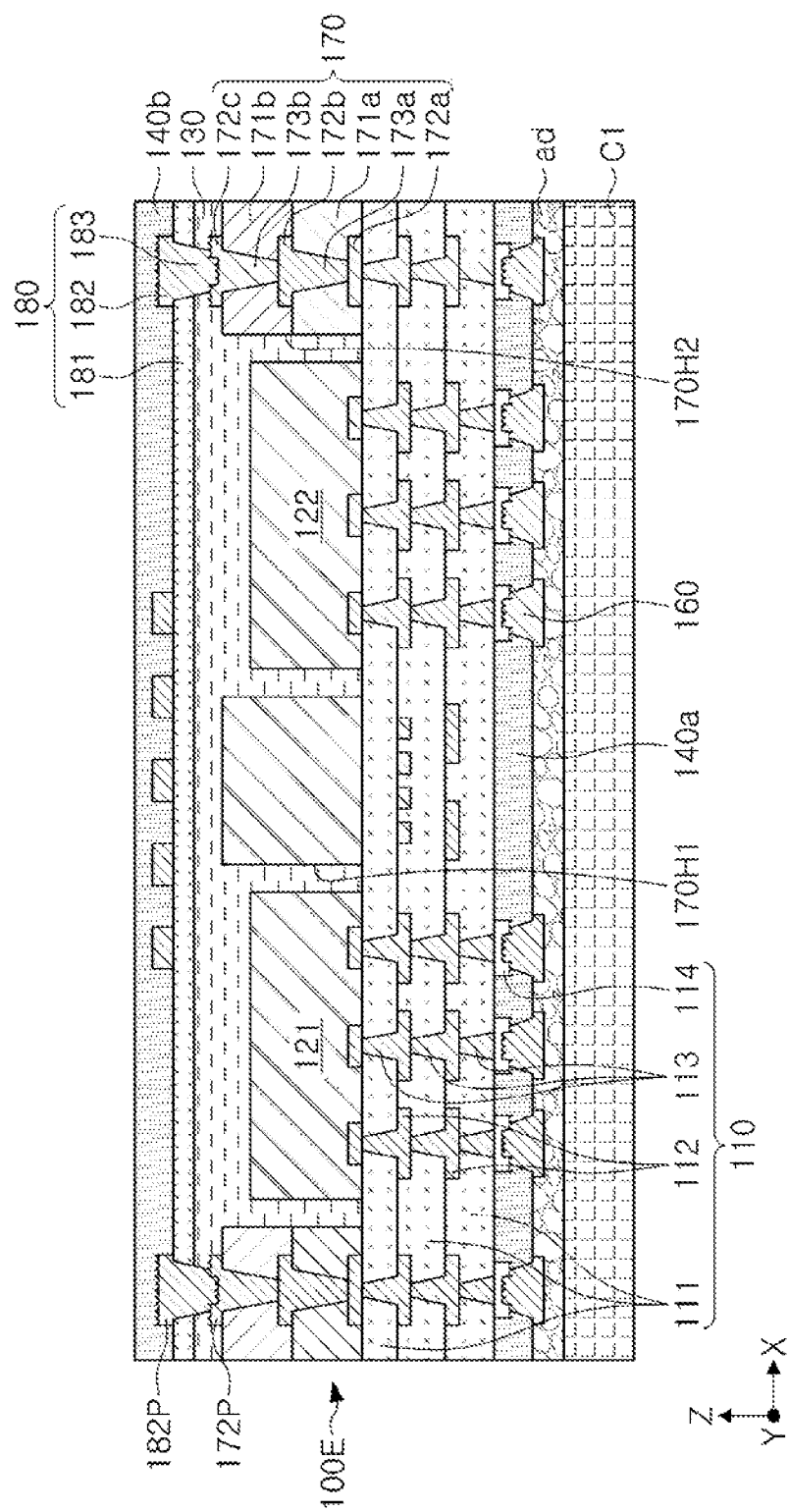
FIGS. 9A and 9B are cross-sectional views schematically illustrating a manufacturing process of a region 'B3 in the semiconductor package of FIG. 7A.
Figure 9B:
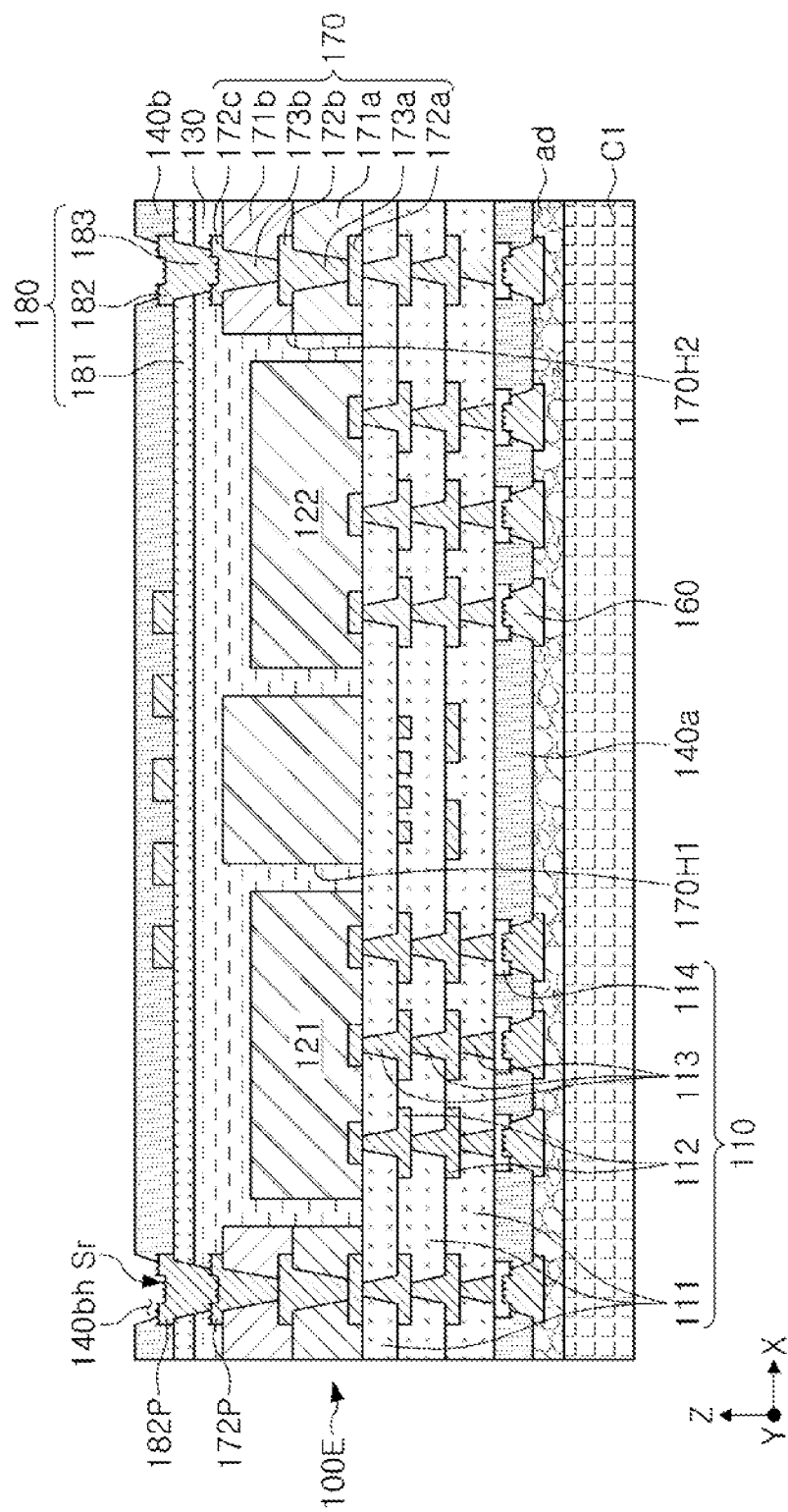

FIGS. 7A and 7B are views of a semiconductor package 300C according to an embodiment, FIGS. 8A and 8B are cross-sectional views of stages in a manufacturing process of a region 'B2' in the semiconductor package 300C of FIG. 7A. FIGS. 9A and 9B are cross-sectional views of stages in a manufacturing process of a region 'B3' in the semiconductor package 300C of FIG. 7A. FIG. 7B is a plan view taken along line II-II' of FIG. 7A.

Referring to FIGS. 7A and 7B, the semiconductor package 300C according to an example embodiment may have characteristics similar to those of the semiconductor package 300B illustrated in FIG. 6A, except that the semiconductor package 300C includes a plurality of first semiconductor chips 121 and 122 and a structure similar to a region 'B1' is formed in regions 'B2' and 'B3'. The region 'B1' of FIG. 7A may be understood as having a structure similar to an enlarged region of FIGS. 1A and 4 (corresponding to the region 'A1' of FIG. 3B). In an implementation, similar to that shown in FIG. 1A, the UBM structure 160 may be omitted. The plurality of first semiconductor chips 121 and 122 may be horizontally spaced apart from each other on the redistribution substrate 110 and may include different types of semiconductor chips. In an implementation, a 1-1-th semiconductor chip 121 may include an AP chip, and the 1-2-th semiconductor chip 122 may include a power management integrated circuit (PMIC) chip.

The vertical connection structure 170 may include a plurality of through holes 170H1 and 170H2 for accommodating the plurality of first semiconductor chips 121 and 122, respectively. In an implementation, the vertical connection structure 170 may include a first through hole 170H1 in which the 1-1-th semiconductor chip 121 is disposed and a second through hole 170H2 in which the 1-2-th semiconductor chip 122 is disposed. In an implementation, the vertical connection structure 170 may include a plurality of insulating layers 171a and 171b, a plurality of wiring layers 172a, 172b, and 172c, and a plurality of wiring vias 173a and 173b. In an implementation, the vertical connection structure 170 may include a first wiring layer 172a on the upper surface 110S2 of the redistribution substrate 110, a first insulating layer 171a covering the first wiring layer 172a, a second wiring layer 172b on the first insulating layer 171a opposite to the first wiring layer 172a, a first wiring via 173a connecting the first wiring layer 172a to the second wiring layer 172b through the first insulating layer 171a, a second insulating layer 171b covering the third wiring layer 172b, a third wiring layer 172c on the second insulating layer 171b, and a second wiring via connecting the second wiring layer 172b to the third wiring layer 172c through the second insulating layer 171b.

Referring to FIGS. 8A and 8B, a recess surface Sr including regular depressions and protrusions may be formed on the uppermost wiring layer 172c (or wiring pad 172P) of the vertical connection structure 170.

First, a package structure in which the vertical connection structure 170, the first semiconductor chips 121 and 122, and the first encapsulant 130 are formed on the redistribution substrate 110 may be attached on a carrier C1, and an insulating layer 181 may be formed on the first encapsulant 130. The rear insulating layer 181 may include an insulating resin (e.g., ABF) in which an inorganic filler is impregnated. The wiring pad 172P may have surface roughness formed before the first encapsulant 130 is formed.

Next, an opening 181h exposing a portion of the wiring pad 172P may be formed by removing the rear insulating layer 181 and the first encapsulant 130 on the wiring pad 172P using a laser beam. The laser beam may be an ultra-short pulse laser having a peak power of 40 kW or more and a pulse width of picoseconds or less. In an implementation, the recess surface Sr including the regular depressions and protrusions shown in FIGS. 1A and 1B may be formed on an upper surface of the wiring pad 172P. In this case, after the opening 181h is formed, a chemical desmear process may be omitted, and connection reliability between the wiring pad 172P and the rear redistribution via 183 may be improved.

Referring to FIGS. 9A and 9B, the recess surface Sr including regular depressions and protrusions may be formed on the redistribution pad 182P of the rear redistribution structure 180. Following the working process of the wiring pad 172P illustrated in FIG. 8B, a rear redistribution layer 182, a rear surface redistribution via 183, and a second protective layer 140b may be formed. The rear redistribution layer 182 and the rear redistribution via 183 may be formed using a plating process and an etching process. The redistribution pad 182P of the rear redistribution layer 182 may have surface roughness formed before the second protective layer 140b is formed. The second protective layer 140b may include, e.g., ABF.

Next, the second protective layer 140b on the redistribution pad 182P may be removed using a laser beam to form an opening 140bh exposing a portion of the redistribution pad 182P. The laser beam may be an ultra-short pulse laser as described above. In an implementation, the recess surface Sr including the regular depressions and protrusions shown in FIGS. 1A and 1B may be formed on the upper surface of the redistribution pad 182P. In this case, after the opening 140bh is formed, a chemical desmear process may be omitted and connection reliability between the redistribution pad 182P and the metal bump 214 may be improved. In an implementation, a plating layer (e.g., nickel (Ni)/gold (Au)) may be formed on an upper surface of the redistribution pad 182P.

By way of summation and review, connection reliability between the semiconductor package and the substrate may be affected by a contact state between the connection bump and the redistribution layer of the semiconductor package. In order to help improve reliability of the semiconductor package, a process of removing a smear between the connection bump and the redistribution layer (or pad) may be performed.

One or more embodiments may provide a semiconductor package having excellent reliability.

As set forth above, according to embodiments, a semiconductor package having excellent reliability by working (or processing) a pad in contact with the bump, and a method of manufacturing the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a redistribution substrate having a lower surface and an upper surface opposite to the lower surface, the redistribution substrate including:
   a pad adjacent to the lower surface thereof, the pad having a first surface and a second surface opposite to the first surface, and
   a redistribution layer electrically connected to the pad;
a semiconductor chip on the upper surface of the redistribution substrate and electrically connected to the redistribution layer;
an encapsulant encapsulating at least a portion of the semiconductor chip;
a protective layer on the lower surface of the redistribution substrate and having an opening exposing at least a portion of the first surface of the pad; and
a connection bump on the protective layer, the connection bump is in contact with the portion of the first surface of the pad through the opening of the protective layer, wherein the portion of the first surface exposed through the opening includes:
   a recess surface, the recess surface including depressions and protrusions and being depressed inwardly toward the second surface, the depressions and protrusions including a groove extending in a ring shape on a plane parallel to the first surface of the pad, and
   an edge surface, the edge surface and having a step difference with respect to the recess surface.

2. The semiconductor package as claimed in claim 1, wherein the recess surface is at a level between a level of the second surface of the pad and a level of the edge surface.

3. The semiconductor package as claimed in claim 1, wherein:
the recess surface is at a center of the opening, and
the edge surface is at a periphery of the center and surrounding the recess surface.

4. The semiconductor package as claimed in claim 1, wherein a ratio of a diameter of the recess surface to a diameter of the portion of the first surface exposed through the opening is about 0.98:1 to 0.9:1.

5. The semiconductor package as claimed in claim 1, wherein the depressions and protrusions of the recess surface include a groove portion having a depth within a range of about 50 nm to about 150 nm.

6. The semiconductor package as claimed in claim 1, wherein the recess surface has surface roughness of about 0.2 μm or less.

7. The semiconductor package as claimed in claim 1, wherein the edge surface has surface roughness of about 0.8 μm or more.

8. The semiconductor package as claimed in claim 1, wherein the protective layer includes an insulating resin in which an inorganic filler is impregnated.

9. A semiconductor package, comprising:
a redistribution substrate including an insulating layer, a redistribution layer on the insulating layer, and a pad partially embedded in a side of the insulating layer opposite to the redistribution layer so that a lower surface of the pad is exposed from the insulating layer, the lower surface of the pad including:
   a recess surface including regular depressions and protrusions, the regular depressions and protrusions including peaks and valleys having a uniform pitch and depth, and
   an edge surface surrounding the recess surface and including irregular depressions and protrusions, the irregular depressions and protrusions including peaks and valleys having different pitches and depths;
a semiconductor chip on the redistribution substrate and electrically connected to the redistribution layer; and
a protective layer on a side of the redistribution substrate opposite to the semiconductor chip, the protective layer including an opening exposing at least the recess surface of the lower surface of the pad.

10. The semiconductor package as claimed in claim 9, wherein a minimum width of the opening in a horizontal direction is greater than or equal to a maximum width of the recess surface in the horizontal direction.

11. The semiconductor package as claimed in claim 9, wherein the opening further exposes at least a portion of the edge surface.

12. The semiconductor package as claimed in claim 9, wherein the recess surface and the edge surface face in the same direction and are positioned at different levels.

13. The semiconductor package as claimed in claim 9, wherein the regular depressions and protrusions have a plurality of ring shapes in which a smaller ring is within a larger ring in a plan view.

14. The semiconductor package as claimed in claim 9, further comprising:
an under bump metallization (UBM) structure in the opening and protruding from the protective layer; and
a connection bump on the UBM structure.

15. The semiconductor package as claimed in claim 9, wherein:
the insulating layer includes a photosensitive resin, and
the protective layer includes a non-photosensitive resin in which an inorganic filler is impregnated.

16. A semiconductor package, comprising:
a redistribution substrate including an insulating layer, a redistribution layer in the insulating layer, and a pad partially embedded in one side of the insulating layer opposite to the redistribution layer so that a lower surface of the pad is exposed from the insulating layer, the lower surface of the pad including a recess surface and an edge surface surrounding the recess surface;
a semiconductor chip on the redistribution substrate and electrically connected to the redistribution layer;
an encapsulant encapsulating at least a portion of the semiconductor chip; and
a protective layer on the one side of the insulating layer of the redistribution substrate opposite to the semiconductor chip, the protective layer including an opening exposing the recess surface and at least a portion of the edge surface,
wherein:
an interval in a vertical direction between the edge surface and an upper surface of the pad is greater than an interval in the vertical direction between the recess surface and the upper surface of the pad,
a surface roughness (Ra) of the recess surface is less than a surface roughness (Ra) of the edge surface,
the recess surface includes depressions and protrusions having a plurality of concentric shapes radially spaced apart from each other in a plan view.

17. The semiconductor package as claimed in claim 16, wherein the encapsulant includes an epoxy molding compound, and the protective layer includes Ajinomoto Build-up Film.

* * * * *